United States Patent [19]

Knapp

[11] Patent Number: 5,211,824
[45] Date of Patent: May 18, 1993

[54] METHOD AND APPARATUS FOR SPUTTERING OF A LIQUID

[75] Inventor: Karl E. Knapp, Tarzana, Calif.

[73] Assignee: Siemens Solar Industries L.P., Camarillo, Calif.

[21] Appl. No.: 786,202

[22] Filed: Oct. 31, 1991

[51] Int. Cl.$^5$ .............................................. C23C 14/34
[52] U.S. Cl. ........................ 204/192.15; 204/192.12; 204/298.12; 204/298.22; 204/298.21; 204/298.23
[58] Field of Search ........... 204/192.1, 192.12, 192.15, 204/298.01, 298.02, 298.09, 298.12, 298.19, 298.2, 298.21, 298.22, 298.23, 298.24

[56] References Cited

U.S. PATENT DOCUMENTS

3,799,862  3/1974  Krutenat ................... 204/298.12 X
4,422,916 12/1983  McKelvey ................. 204/298.09 X
4,443,318  4/1984  McKelvey ..................... 204/298.23
4,530,750  7/1985  Aisenberg et al. ............. 204/298.24
5,064,520 11/1991  Miyake et al. ............. 204/298.23 X
5,065,697 11/1991  Yoshida et al. ............ 204/298.02 X

*Primary Examiner*—Nam X. Nguyen

[57] ABSTRACT

A method and apparatus for practicing the method of sputtering target material onto a substrate by utilizing a cathode member of a sputtering apparatus, the cathode member having an exterior surface. The method comprises applying a liquid target material to a generally downwardly exposed surface portion of the exterior surface of the cathode member such that at least a portion of the liquid target material exhibits a generally downwardly exposed surface and positioning next to the surface of the cathode member the substrate for receiving target material sputtered from the liquid target material exhibiting a generally downwardly exposed surface.

113 Claims, 4 Drawing Sheets

METHOD AND APPARATUS FOR SPUTTERING OF A LIQUID

FIELD OF THE INVENTION

The present invention relates to the field of cathode sputtering and, in particular, to an apparatus and method for cathode sputtering, and more particularly to cathode sputtering of a liquid target applied in a liquid form to a cathode.

BACKGROUND OF THE INVENTION

A known used method for depositing thin films of materials onto substrates is cathode sputtering. The process involves vaporizing a target material by ion bombardment. The target usually forms a part of a cathode assembly placed in a chamber which is evacuated. An inert gas such as argon fills the chamber. An electric field is applied between the cathode assembly and an anode positioned within the chamber and electrons are ejected from the surface of the cathode. The inert gas is ionized by collision with the ejected cathode electrons to form positive gas ions which are attracted to the cathode surface. Particles of the target material are dislodged when the positive ions impact the target. The trajectory of these target particles is such that they traverse the enclosure and deposit as a thin film onto a positioned substrate.

As a result of efforts, in part, to increase and intensify deposition rates of target materials onto substrates, it is known to use magnetron sputtering in which a magnetic field is formed over the target surface. Known magnetically enhanced sputtering devices have in common a closed tunnel of magnetic lines of force over the sputtering surface formed by a magnetic system situated behind the sputtering surface, the tunnel serving to increase the ionization probability. The magnetic field formed is a closed loop over the surface of the target and is superimposed on the electric field. The magnetic field deflects and traps the electrons ejected or emitted from the surface of the target cathode so that they move in confined paths and are trapped in confined spaces above the target surface, usually in an annular region adjacent to the surface of the target. By so increasing the number and density of electrons trapped in the region nearer the surface of the target, the likelihood that the number of collisions of the electrons with atoms of the inert gas in the space near the target are increased to produce an increase in the number of ions in that region, and thus increasing the useful production of ions. Such increased number of ions are therefore available to be attracted to the target material cathode, resulting in a higher rate of ion bombardment of the target, which upon impact with the target, yields an increased emission rate of sputtering material and thus a more rapid erosion of the target surface. The result is a substantially higher sputtering rate for the same sputtering material than without the aid of a magnetic field.

However, even with magnetic sputtering, the erosion pattern of planar cathode targets results in both low utilization of the target material and uneven target utilization. Thus, although magnetically enhanced sputtering provides improvement in rates of sputtering, the planar target typically erodes through at some point before more than a substantial majority of the total target has sputtered away.

Erosion occurs in a relatively narrow ring shaped region, or a trough, or racetrack shaped region, corresponding to the shape of the closed loop magnetic field. If expensive target materials or targets, either because of their rarity, purity, or difficulty of fabrication, are used, a cost problem arises from the low utilization of the target. Erosion prematurely renders the further use of the target uneconomical, or results in unacceptable non-uniform emission rates and substrate deposition rates. Undesirable erosion patterns on target surfaces can alter the target surface geometry resulting in a departure from the initial emission pattern of the target material which in turn results in undesirable changes in the deposition distribution on the substrate. Efforts to overcome low target utilization involve increasing the area which is significantly eroded before any point erodes all the way through the target.

When other factors which influence the use and selection of target materials are considered and which indirectly influence the flow through or down time of the sputtering process, serious compounded cost problems arise. Since conventional planar magnetron sputtering targets have a target utilization which is approximately 10 to 30%, and because target materials can be very expensive either because of the value of the material or because of the required purity, it is often required to maintain an inventory of targets as well as establish procedures to recover the target materials from scrap targets.

In order to compensate for non-uniform erosion and to increase target utilization, some devices intentionally cause non-uniform emission rates from target surfaces. Reduction in target loss has also been accomplished by moving the target relative to the magnetic field pattern or vice versa by either mechanical or electromechanical methods or techniques. Movement of the magnetic field pattern includes mechanically moving magnetic elements or electrically moving the sputtering plasma by changing electrical fields.

The permissible thickness of cathode targets is limited for a given magnet strength and size for conventional cathode sputtering apparatus because the magnets are placed behind the target and target support whereas a magnetic field of predetermined strength is required in front of the target. Associated with the permissible thickness limitation is a limitation on the amount of sputtering target material and the concomitant constraint in sputtering time before the target must be replaced. Production systems have been used in which substrates are transported on a continuously moving conveyor system underneath and transverse to the magnetron cathode assembly. It is therefore desirable to obtain as high a continuous sputtering time from a target as is possible without having to limit the rate of deposition. When the target material has to be replaced or repositioned within an evacuated deposition chamber, re-evacuation, decontamination, and re-introduction of inert gas is required after each shutdown. Although magnets of increased field strength can be used to apparently overcome the thickness limitation, the problem of low target material percentage utilization still exists.

Some sputtering devices utilize multiple targets with multiple electro-mechanical components, circuitry, and controls which result in generally greater costs, increased manufacturing and maintenance problems, and greater complexity in their operation.

Yet other attempts to further improve the sputtering process include magnetic field shaping structures as well as improved mechanisms to raise and lower the target with respect to the substrate and adjust the angular position of the target with respect to the substrate being coated.

Although these devices and approaches increase the utilization percentage of the target, the increase in cost of the cathode upon which the target is mounted and the increased complexity result in decreased equipment reliability. Such decreased reliability compromises the purpose of the improved magnetically enhanced planar apparatus which can result in a decrease rather than an increase in overall utility.

Further efforts to increase target utilization have led to the development of rotatable magnetron sputtering apparatus. Typically, such devices include a target cathode tube which is rotated around a fixed magnetic array. The tube is mounted in a horizontal position for rotation about its longitudinal axis. The cathode tube has a preformed tubular layer of target material applied to its outer surface and the magnetic means is located within the tube. The cathode tube can be rotated so that each portion of the preformed target affixed to the cathode tube can be rotated into position relative to the substrate for sputtering. Individual preformed target strips, with either the same or different coating materials to be sputtered, can be arranged in a spaced relation and secured to the cathode tube. To provide the requisite heat removal and cooling of the cathode assembly of magnetically enhanced apparatus, a cooling system must also be provided. The deposition rate and permissible target material thickness of low melting point target materials are frequently limited by the rate at which heat can be transferred from the target surface.

Another problem associated with sputtering apparatus and with rotating magnetrons is that the preformed target material has to be affixed to or mounted on the cathode of the rotating cathode or a support affixed to the rotating cathode. Typical means of attaching the target to the cathode or support include bonding, mechanical attachment such as clamping or screwing, and simple mounting by friction or close fit. The attachment must generally be physically strong, make good thermal and electrical contact, and must not contain areas of entrained foreign materials which can contaminate the deposition layer under the evacuated conditions within the chamber. If the target is soldered to a backing plate, it is sometimes very difficult to separate one from the other in order that the unused target material and backing plate can be re-used.

Existing techniques for sputtering liquid materials can be applied for upward deposition on downward-facing substrates utilizing standard planar sputtering cathodes as disclosed in U.S. Pat. No. 3,799,862, issued Mar. 26, 1974 (Krutenat), herein incorporated by reference, and in corresponding German Patent No. 2254434. The technique does not allow downward sputtering onto an upward-facing substrate, as is the preferred orientation for large-area coating systems.

OBJECTS OF THE INVENTION

One of the objects of the present invention is to allow downward sputtering onto an upward-facing substrate.

Another object of the present invention is to allow sputtering at an angle different from the vertical.

It is an advantage and improvement over prior art devices and is an object of the present invention to provide an improved rotatable magnetron sputtering apparatus that provides consistent sputtering rates and fluxes, effectively does not suffer target erosion nor changes in target geometry due to erosion, provides maximum utilization of the target material, does not need preformed targets or target strips, is inexpensive, and is adaptable for use with existing rotating magnetron devices.

It is another object of the present invention to provide a method of sputtering by applying a liquid target material to a rotating cathode of a magnetron sputtering apparatus.

It is another object of the present invention to provide a method of sputtering where liquid target material is applied to the rotatable cathode of a rotatable magnetron as the target material is depleted without having to interrupt the sputtering process to replace spent targets.

It is another object of the present invention to maintain deposition uniformity of the target material on the substrate during sputtering.

It is another object of the present invention to sputter liquid targets by a rotatable cathode in a downward direction.

SUMMARY OF THE INVENTION

In accordance with a first aspect of the invention, a method of sputtering target material onto a substrate by utilizing a cathode member of a sputtering apparatus, the cathode member having an exterior surface, comprises the steps of:
(a) applying a liquid target material to the exterior surface of the cathode member such that at least a portion of the liquid target material exhibits a surface generally exposed in a direction other than vertically upwards; and
(b) positioning next to the surface of the cathode member the substrate for receiving target material sputtered from the liquid target material exhibiting a surface generally exposed in a direction other than vertically upwards.

In accordance with a second aspect of the invention, sputtering apparatus for sputtering a target material upon a substrate, comprises:
(a) an evacuable coating chamber;
(b) a cathode assembly having an outer surface;
(c) a pool for liquid target material to be sputtered;
(d) means for applying a layer of the liquid target material from the pool of liquid target material on the outer surface of the cathode assembly such that at least a portion of the layer exhibits a surface generally exposed in a direction other than vertically upwards; and
(e) means for transporting substrates into the vicinity of the cathode assembly for receiving target material sputtered from the layer of the liquid target material exhibiting the surface generally exposed in a direction other than vertically upwards.

In accordance with another aspect of the invention, a method of sputtering target material onto a substrate by utilizing a cathode member of a sputtering apparatus, the cathode member having an exterior surface, comprises the steps of:
(a) applying a liquid target material to a portion of the exterior surface of the cathode member such that at least a portion of the liquid target material exhibits a generally downwardly exposed surface; and
(b) positioning next to the surface of the cathode member the substrate for receiving target material sputtered from the liquid target material exhibiting a generally downwardly exposed surface.

In accordance with another aspect of the invention, step (a) is performed by applying the liquid by intermediate transfer means to the exterior surface of the cathode member.

In accordance with still another aspect of the invention, sputtering apparatus for sputtering a target material upon a substrate comprises:
(a) an evacuable coating chamber;
(b) a cathode assembly having an outer surface;
(c) a pool for liquid target material to be sputtered;
(d) means for applying a layer of the liquid target material from the pool of liquid target material on the outer surface of the cathode assembly such that at least a portion of the layer exhibits a generally downwardly exposed surface; and
(e) means for transporting substrates into the vicinity of the cathode assembly for receiving target material sputtered from the layer of the liquid target material exhibiting the generally downwardly exposed surface.

In accordance with still another aspect of the invention, the cathode assembly has a generally downwardly exposed surface portion.

In accordance with a further aspect of the invention, a magnetron cathode sputtering apparatus comprises:
(a) an evacuable coating chamber;
(b) a cathode assembly having an outer surface;
(c) magnetic means positioned at least partially in the carrier means for providing a defined sputter zone;
(d) a pool within the chamber for liquid target material to be sputtered, the pool extending parallel to and adjacent the outer surface of the carrier means;
(e) means for applying a layer of liquid target material from the pool of liquid target material on the outer surface of the cathode assembly; and
(f) means for supporting and positioning substrates to be coated in the chamber and in proximity to the sputtering zone.

In accordance with yet a further aspect of the invention, a magnetron sputtering apparatus has an evacuable coating chamber; a cathode assembly has an elongated rotatable carrier arrangement is mounted in the chamber, the carrier arrangement has an outer surface; a magnetic means is positioned at least partially in the carrier means for providing a sputter zone of defined width extending lengthwise of the carrier means; means for rotating the carrier means; a pool within the chamber for liquid target material to be sputtered, the pool extending parallel to and adjacent to the outer surface of the carrier means; means for applying a layer of liquid target material from the pool of liquid target material on the outer surface of the carrier means for sputtering; means for supporting and positioning substrates to be coated in the chamber and in proximity to the sputtering zone.

Further objects of the present invention are achieved by providing a method of sputtering target material onto substrates by utilizing a rotatable cathode member of a magnetron sputtering apparatus, the cathode member having an exterior surface, comprising the steps of applying a liquid target material to the rotatable exterior surface of the rotatable cathode member, and positioning next to the rotating exterior surface of the rotatable cathode member the substrates to receive the target material sputtered from said liquid target material.

These and other objects of the invention will be more fully understood from the detailed description following, taken in conjunction with the drawings.

DESCRIPTION OF THE PREFERRED EMBODIMENT

Figure 1:
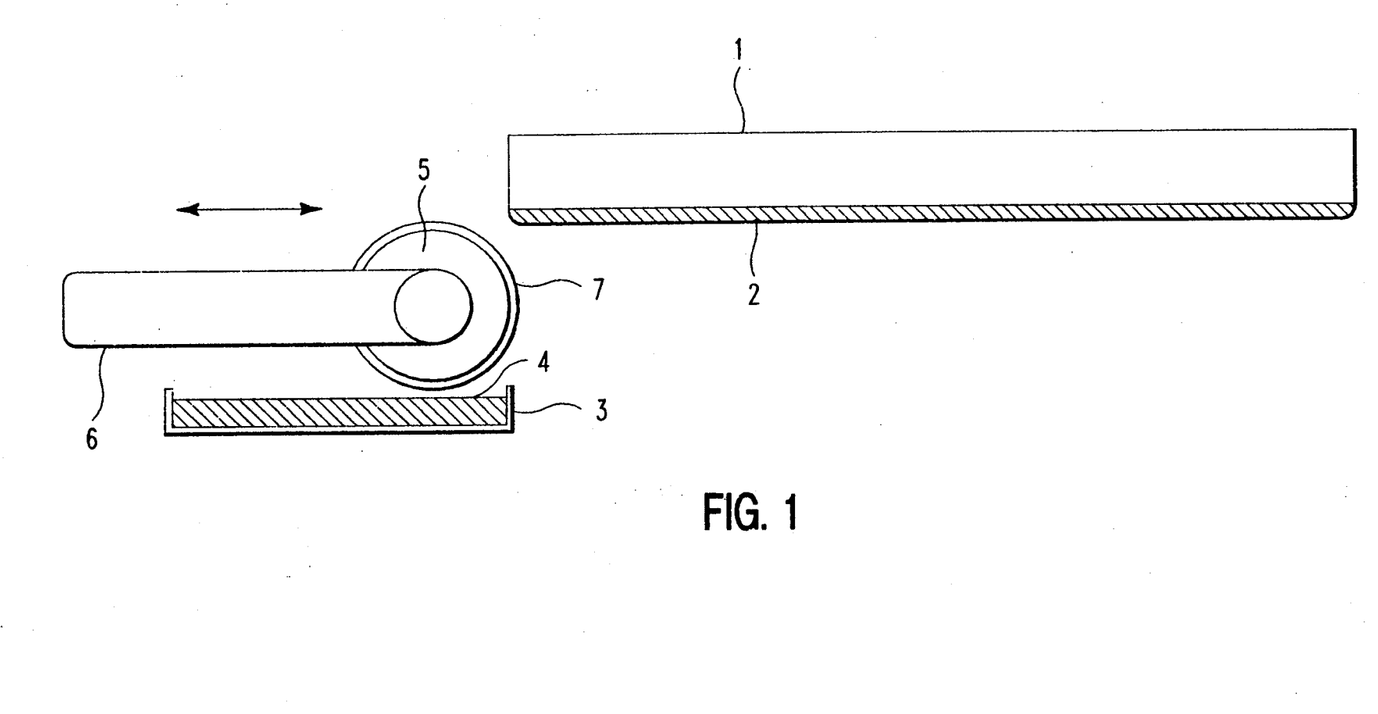
FIG. 1 shows a diagrammatic representation, not necessarily to scale, of an embodiment in accordance with the invention.

Referring to FIG. 1, a carrier 1 is provided for carrying a layer of target material 2 to be sputtered onto an object, for example, a substrate, not shown. It will be understood that magnets associated with carrier 1 are not shown in order to simplify the figure and the description. A reservoir 3 is provided for containing a supply of liquified target material 4. A roller 5 is mounted on an operating arrangement shown symbolically as 6, the whole is enclosed in an evacuable containing chamber, not shown. As will be further explained later, it is not necessary that all of the elements shown be enclosed in the evacuable containing chamber. FIG. 1 shows carrier 1 in a horizontal position; however, carrier 1 is capable of being positioned at any desired angle. Thus, carrier 1 may be positioned such that layer 2 of the target material faces in a generally upward position so as to allow direct sputtering of downward facing objects, such as substrates. For such an embodiment wherein carrier 1 can be moved to different angles, carrier 1 is mounted using a hinged mounting (not shown) such as an axle or pivot or, for example, an adjustable clamping arrangement. Carrier 1 can also be arranged to have faces for different directions of sputtering, the respective face required being arranged to receive a layer of target material from roller 2.

In operation, the containing chamber, not shown, is evacuated and roller 5 is caused by operating arrangement 6 to contact the supply of liquid target material 4, as by dipping and rotating, so as to receive a coating 7 of the liquid target material. Operating arrangement 6 then causes roller 5 to move into contact with the under surface of carrier 1 and to deposit thereupon, as by rolling, a layer or coating of the liquid target material 2. Thus, roller 5 serves as an intermediate transfer apparatus for transferring liquid target material from reservoir 3 to carrier 1 for maintaining a supply of such target material on carrier 1 for sputtering. Carrier 1 is thus able to present an exposed under surface of liquid target material for sputtering onto objects placed under carrier 1 in the orientation shown by way of example in FIG. 1. In other words, the liquid target material exhibits a generally downwardly exposed surface, meaning the free surface not in contact with carrier 1 and where downwards is defined as being in the direction of the pull of gravity. It is therefore possible, for example, to allow downward sputtering onto an upward-facing substrate which, as has been stated, is the preferred orientation for large-area coating systems. In such applications, the downward facing orientation of carrier 1 is particularly advantageous. However, it is not necessary that the sputtering be in a vertical downward direction; indeed, sputtering with the described embodiment of the invention can take place at any angle to the vertical. In certain particular applications, there can be advantages to sideways sputtering in which the object to be sputtered is adjacent the layer of target material 2. This mode of operation merely requires carrier 1 to be positioned with its sputtering surface vertically oriented for receiving a layer of liquid target material from roller 2 which is then correspondingly oriented to transfer target material.

When, as in the prior art, sputtering is from a pool of liquid sputtering material, the layer formed by sputtering is only relatively uniform when sputtering is directly upward; otherwise, the layer thickness is governed by a non-uniform distribution function, such as a cosine function. As the present invention makes possible sputtering in any desired orientation, upward, downward, or sideways, sputtering can be carried out, for example, directly upwards or at an angle, including at a small angle, to the vertical. Sputtering a uniform layer is possible at any angle and thus offers an advantage over sputtering from a horizontal pool at all angles deviating from an exactly vertically upward direction.

Other embodiments are derived from the embodiment of FIG. 1 in which means other than roller 5 are employed for effecting transfer of the liquid target material. Thus, transfer may be carried out by application by a wiper arrangement or by spraying of the liquid target material onto carrier 1. Furthermore, by way of example, application of the liquid target material may be carried out by brushing, dripping, flowing, smearing, centrifuging the liquid target material, or by immersing carrier 1 in the liquid target material. A combination of the foregoing processes may also be utilized. Such variations, not shown in the present figures, do not basically change the principles of operation of the described embodiment.

Figure 2:
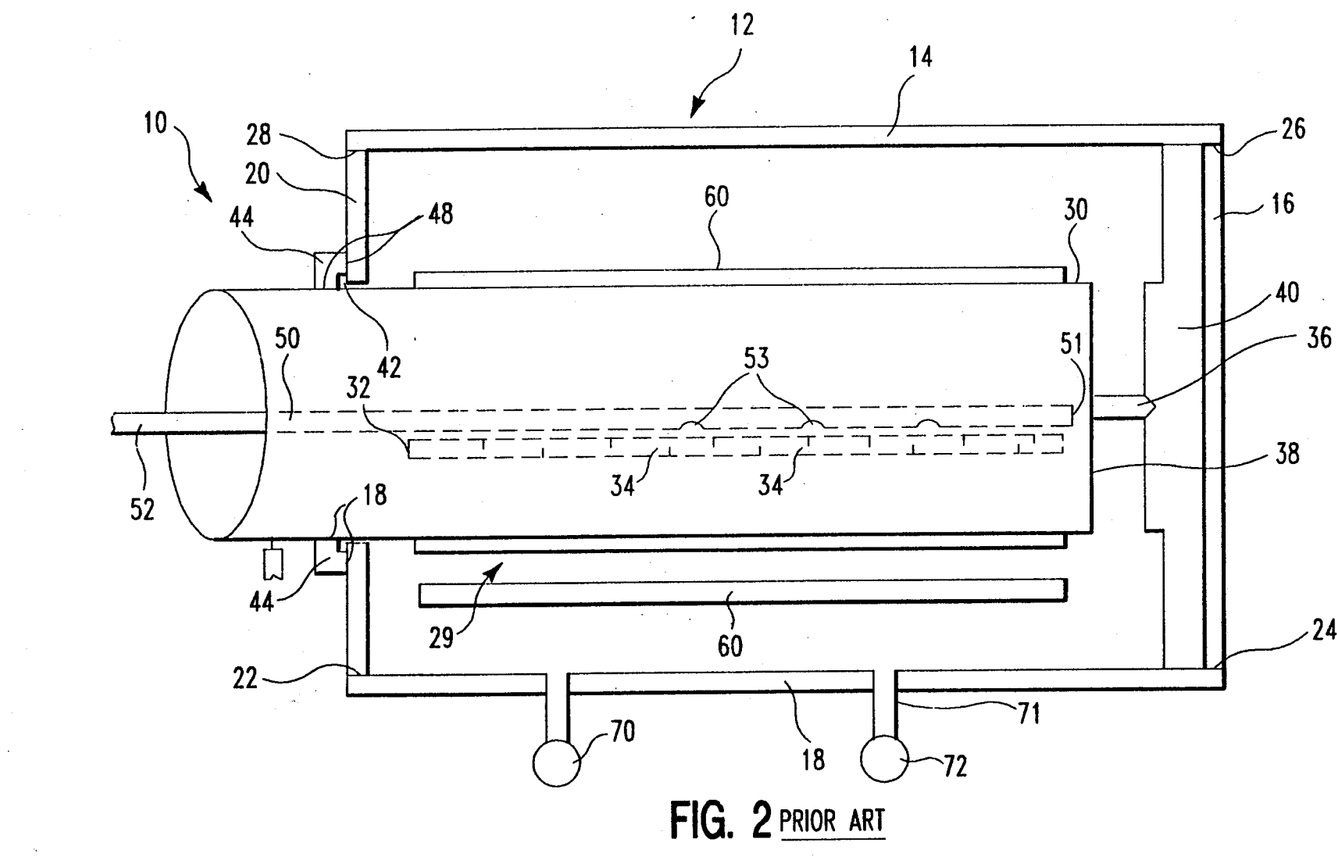
FIG. 2 is a vertical longitudinal section through a typical coating chamber, not necessarily to scale, showing, partly in schematic, a prior art rotatable magnetron cathode.

Referring now to FIG. 2, a known rotating magnetron sputtering apparatus, such as is shown and described in U.S. Pat. No. 4,422,916 which is hereby incorporated by reference, is indicated generally by the reference numeral 10 and is mounted in an evacuable coating chamber 12. The chamber 12 shown is rectangular in shape and is formed of walls 14, 16, 18, 20, and end walls (not shown) which are jointed together and sealed with hermetic seals 22, 24, 26, 28. A vacuum pump 70 evacuates the interior of chamber 12 to the desired pressure. Gas may be injected into chamber 12 through conduit 71 and control valve 72. The substrates to be coated are supported on and carried horizontally beneath cathode assembly 29 by conveyor means 80. A cathode assembly 29 comprising an elongated cylindrical tube 30 is mounted lengthwise in chamber 12. Tube 30 is supported in a horizontal position within coating chamber 12 and is mounted for rotation about its longitudinal axis. A tubular preformed target 60 to be sputtered is affixed to tube 30.

Tube 30 is supported at its inner end by trunnion 36 secured to the closed inner end 38 of the tube 30. Trunnion 36 is journaled in a bearing block 40 which is secured to wall 16. Mounted within tube 30 is a magnetic means 32 including a plurality of magnets 34 secured to a conduit 50 and arranged in two parallel rows that extend lengthwise in tube 30. The magnets 34 in each row are aligned with one another, with the magnets in one row being disposed alternately with, and overlapping the magnets in the other row. Magnetic strips (not shown) are mounted onto magnets 34 within tube 30 and establish two straight magnetic fields along the length of tube 30. By means of continuously or intermittently rotating tube 30 around its horizontal axis, a selected portion of the preformed target material 60 can be positioned directly opposite the magnets and within the magnetic field. Continuous rotation of tube 30 during sputtering can be accomplished by modifying the apparatus in FIG. 2 to further include a drive means (not shown) including motor means, associated sprockets, chains, and gears positioned outside of chamber 12. The drive means engages a shaft (not shown) which penetrates chamber 12 and engages gears (not shown) which rotate tube 30 upon which the target material is mounted. Tube 30 is open at its outer end and extends through an opening in the side wall 20 of chamber 12 where it is supported in an annular ring 42 surrounded by a collar 44. O-rings 48 engage tube 30 and side wall 20 and seal the interior of coating chamber 12 from the atmosphere. Tube 30 can also be enclosed within chamber 12 and continuously rotated as in the prior art apparatus shown in FIG. 9 of U.S. Pat. No. 4,422,916.

To provide cooling of cathode assembly 29, coolant conduit 50 of non-magnetic material is shown extending longitudinally in tube 30. The inner end 51 of conduit 50 is closed while the outer end 52 extends beyond the end of tube 30 where coolant is introduced. Coolant passes through openings 53 in conduit 50 and circulates throughout tube 30 and exits at the outer end of tube 30.

Figure 3:
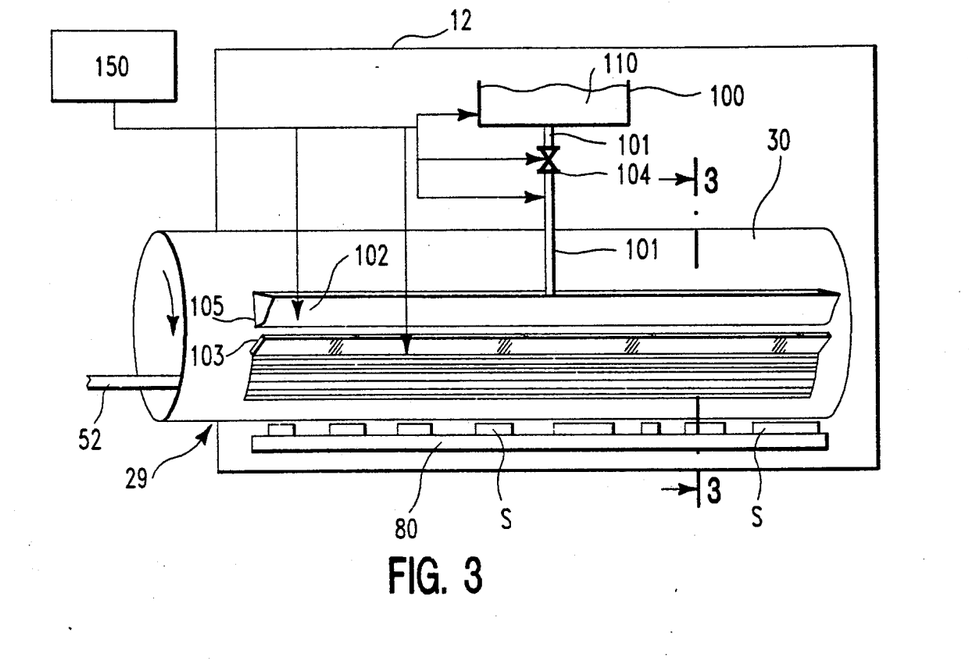
FIG. 3 is a vertical longitudinal section, not necessarily to scale, partly in perspective, showing a portion of an apparatus corresponding to that shown in FIG. 1 and incorporating one embodiment of the present invention.
Figure 5:
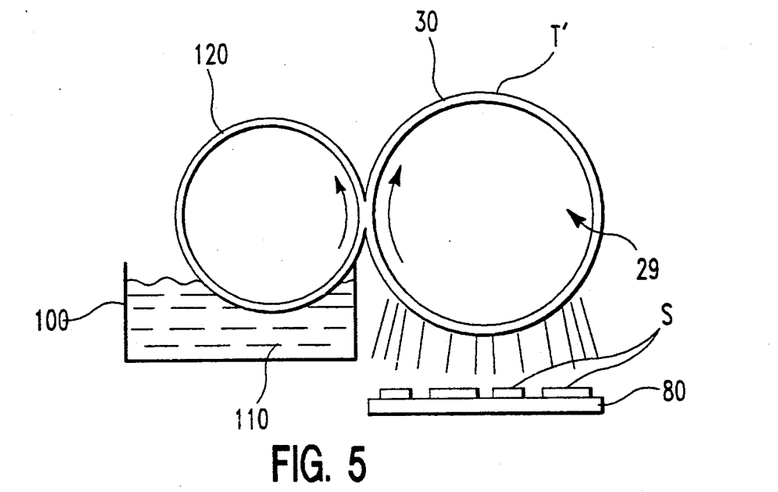
FIG. 5 is a sectional view, not necessarily to scale, in schematic form, of another embodiment of the present invention.

FIG. 3 shows a coating chamber with a rotatable magnetron cathode in which, in accordance with one aspect of the present invention, liquid target material is supplied from a pool of such target material and is applied by a wiper to a carrier means for sputtering the liquid target onto a substrate within the evacuable chamber. In accordance with another embodiment of the invention, the liquid target material is applied by a roller or transfer drum to the carrier means which is shown in FIG. 5 as the surface of a rotatable cathode.

Target materials that are normally liquid at moderate or room temperature and which can be applied to a tubular cathode assembly in accordance with the present invention include gallium, cesium, bismuth, rubidium, indium, tin, and solder alloys. The heat load from prior art magnetically enhanced planar or rotating magnetron sputtering apparatuses would melt and therefore render many materials which are solid at room temperature but have low melting points unsuitable for sputtering. However, such materials can be sputtered by the present invention. By providing a temperature control means for controlling the temperature of the target source material, the physical state of the target source material, if not liquid at room temperatures, may be changed to a liquid by providing heat. Similarly, it is desirable to provide incremental cooling of target source materials by cooling selected portions of the apparatus and to maintain the liquid or liquified target source material at a temperature below its vaporization temperature. It is also desirable to control the temperature of the target source material since both the viscosity and reactivity of the target material are a function of temperature. Metallic mixtures and alloys which may be sputtered by the present invention include standard tin-lead solders, tin-bismuth, tin-lead-bismuth fusible alloys, and a wide variety of indium, gallium, zinc, indium-tin, indium-gallium, and gallium-gold electrical contacting materials.

The inventory of liquid target material to be applied to the rotatable cathode of the magnetron can be positioned either inside or outside evacuable coating chamber 12. FIG. 3 shows a reservoir 100 of liquid target material 110 positioned and supported within chamber 12. A controlled flow of target material is supplied through conduit 101 and remotely activated valve 104 to pool 102 where it descends through slot 105 to wiper 103. Wiper 103 applies a layer or a substantially uniform thickness T of the liquid target material to a carrier means. In a preferred embodiment, the carrier means is shown in FIG. 3 as tube 30. Although not shown, pool 102, wiper 103, and valve 104 are supported within chamber 12 in any conventional manner. The liquid layer or film of target material applied to carrier means or tube 30 is held in place by surface tension. Substrates S are shown positioned on substrate handling means 80 for movement below rotatable cathode tube 30 as the liquid target material is sputtered downward onto the substrates. In an alternative embodiment of the present invention, FIG. 3 also shows in schematic form a temperature control means 150 external to chamber 12 which controls the temperature of the target material by heating and/or cooling reservoir 100, conduit 101, pool 102, wiper 103, and valve 104, either alone or in combination with one another. Any conventionally known heating and cooling techniques or apparatuses may be used to control the temperature of reservoir 100, conduit 101, wiper 103 and valve 104.

Figure 4:
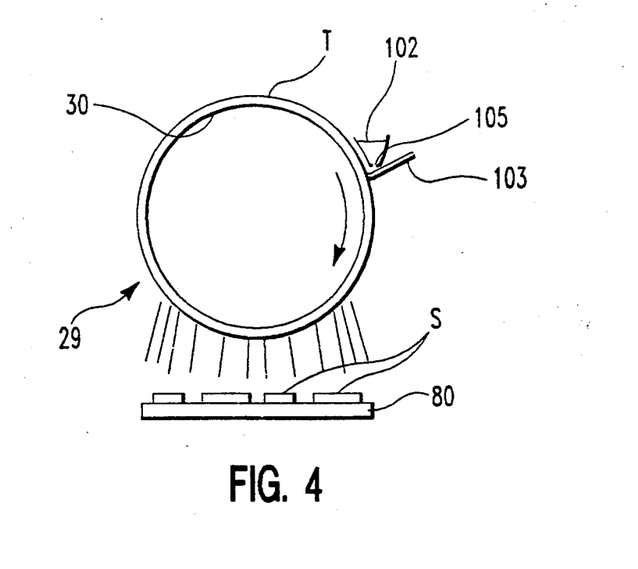
FIG. 4 is a sectional view of FIG. 2, not necessarily to scale, taken along lines 3—3, in schematic form, with the components within the cathode tube deleted for simplicity.

FIG. 4 is a sectional view of FIG. 3 and shows wiper 103 which has applied and maintains a preselected thickness T of target material onto the outer surface of carrier means or tube 30. The thickness can be varied by altering the distance between wiper 103 and the outer surface of tube 30. Liquid target material is supplied to wiper 103 through longitudinal slot 105 in the bottom of pool 102. As tube 30 is rotated, a layer, or as is shown in FIG. 4, a substantially uniform thickness T of liquid target material is continually maintained on the surface of tube 30 without having to interrupt the coating of substrates to change, align, or otherwise adjust the target material. As cathode tube 30 is rotated, additional liquid target material is applied to the sites on the rotatable cathode where local target erosion could have otherwise formed.

By maintaining a layer or a uniform thickness of target material on tube 30, target erosion is eliminated, high target material utilization is achieved, and uniform sputtering emission rates and better substrate deposition rates are achieved. The target surface geometry is effectively unaltered which eliminates departures from the initial target emission pattern and associated undesirable changes in deposition distribution on the substrates. In addition, an expensive preformed target inventory need not be maintained.

In another embodiment of the present invention which is shown in FIG. 5, a transfer drum 120 with its axis positioned parallel to that of cylindrical tube 30 is partially immersed in reservoir 100. Transfer drum 120 is in contact along its length with the surface of tube 30. As tube 30 is rotated in either a clockwise or counter-clockwise direction, transfer drum 120 is caused to be rotated in an opposite direction (as shown by the arrows in FIG. 5) and coats the surface of tube 30 with a substantially uniform thickness T' of liquid target material. The thickness can be varied by altering the pressure exerted by drum 120 upon tube 30 by changing the distance between drum 120 and tube 30. Although not shown in FIGS. 3-5, reservoir 100, valve 104, conduit 101, wiper 103, and transfer drum 120 are electrically isolated from evacuable chamber 12. In another embodiment of the present invention, transfer drum 120 and reservoir 100 are heated and/or cooled by temperature control means 150 (not shown).

Figure 6:
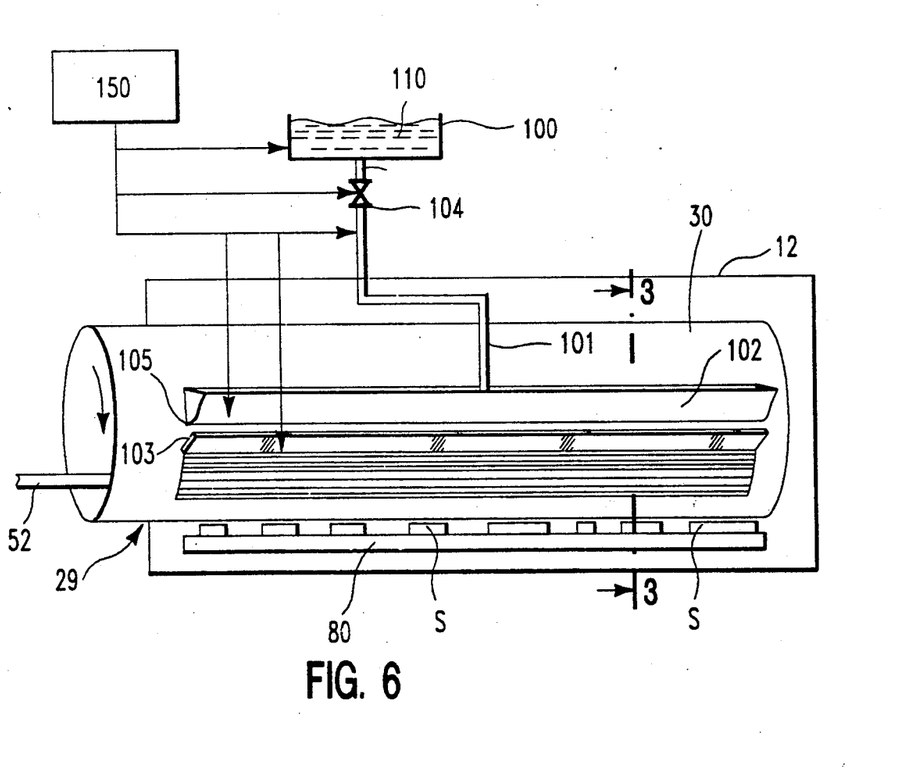
FIG. 6 is a vertical longitudinal section, partly in perspective, not necessarily to scale, showing a portion of the apparatus in FIG. 1 and an alternative embodiment of the present invention.

In a further embodiment of the present invention which is shown in FIG. 6, reservoir 100 is positioned outside instead of within evacuable chamber 12. In this embodiment, valve 104 serves to both isolate reservoir 100 from the pressure conditions within chamber 12 as well as to control the flow of liquid target material to pool 102. In a further alternative embodiment, temperature control means 150 controls the temperature of the target material by heating or cooling reservoir 100, conduit 101, pool 102, wiper 103 and valve 104, either alone or in combination with one another.

In accordance with another aspect of the present invention, a method is provided for sputtering a film of a liquid target material upon substrates in which there is a rotatable tubular cathode member of a magnetron sputtering apparatus, the cathode member having a circular surface, which comprises applying the liquid target material to the rotating circular surface, and passing beneath the circular surface of the rotating tubular cathode member the substrates to receive the liquid material sputtered from the liquid target material.

It should be recognized that various modifications may be made in the apparatus and processes described above without departing from the true scope of the present invention, which is pointed out in the following claims.

I claim:

1. A method of sputtering target material onto an object by utilizing a cathode member of a sputtering apparatus, the cathode member having an exterior surface, comprising the steps of:
   (a) applying a liquid target material by intermediate transfer means to the exterior surface of the cathode member such that at least a portion of said liquid target material exhibits a surface generally exposed in a direction other than vertically upwards; and
   (b) positioning next to the surface of the cathode member the object for receiving target material sputtered from said liquid target material exhibiting a surface generally exposed in a direction other than vertically upwards.

2. The method of claim 1 wherein step (a) is performed by applying the liquid target material by transfer roller means to the exterior surface of the cathode member.

3. The method of claim 1 wherein step (a) is performed by applying the liquid target material by wiper application means to the exterior surface of the cathode member.

4. The method of claim 1 wherein step (a) is performed by applying the liquid target material by spray application means to the exterior surface of the cathode member.

5. The method of claim 1 wherein step (a) is performed by applying the liquid target material to the exterior surface of the cathode member by at least one of the processes selected from the group consisting of brushing, dripping, flowing, smearing, centrifuging, and immersing.

6. The method of claim 1 wherein step (a) is performed by applying the liquid target material to the exterior surface of the cathode member by a combination of any ones of the processes selected from the group consisting of roller transfer, wiping, spraying, brushing, dripping, flowing, smearing, centrifuging, and immersing.

7. The method of claim 1 wherein the object in step (b) is positioned above the surface of the cathode member for receiving the target material sputtered from the liquid target material.

8. The method of claim 1 wherein the object in step (b) is positioned alongside the surface of the cathode member for receiving the target material sputtered from the liquid target material.

9. The method of claim 1 wherein the object in step (b) is positioned under the surface of the cathode member for receiving the target material sputtered from the liquid target material.

10. The method of claim 1 wherein the object in step (b) is positioned relative to the surface of the cathode member for receiving at a predetermined angle the target material sputtered from the liquid target material.

11. The method of claim 1 wherein the cathode member is tubular.

12. The method of claim 11 wherein the cathode member rotates to form a rotating cathode member having a rotating exterior circular surface.

13. The method of claim 12 wherein the step of positioning further includes passing the object alongside the rotating exterior circular surface of the rotating cathode member to receive the target material sputtered from said liquid target material.

14. The method of claim 1 wherein the exterior surface has a cross-sectional shape which is circular.

15. The method of claim 1 wherein the target material is selected from the group consisting of gallium, cesium, bismuth, rubidium, indium, zinc and tin.

16. The method of claim 1 wherein the target material is an alloy selected from the group consisting of tin-lead, tin-bismuth, tin-lead-bismuth, indium-tin, indium-gallium, and gallium-gold.

17. The method of claim 1 further including the step of controlling the temperature of the liquid target material.

18. Sputtering apparatus for sputtering a target material upon an object, comprising:
 (a) an evacuable coating chamber having a sputtering zone;
 (b) a cathode assembly having a rotating cathode and an outer surface;
 (c) a pool for liquid target material to be sputtered;
 (d) means for applying a layer of the liquid target material from a pool of liquid target material on the outer surface of the cathode assembly such that at least a portion of the layer exhibits a surface generally exposed in a direction other than vertically upwards; and
 (e) means for transporting objects into the vicinity of the cathode assembly for receiving target material sputtered from the layer of the liquid target material exhibiting the surface generally exposed in a direction other than vertically upwards.

19. The apparatus as in claim 18 wherein the cathode assembly has a surface portion generally exposed in a direction other than vertically upwards.

20. The apparatus as in claim 18 wherein the surface generally exposed in a direction other than vertically upwards faces generally horizontally.

21. The apparatus as in claim 18 further including a temperature control means for controlling the temperature of the target material.

22. The apparatus as in claim 21 wherein the sputtering zone is below the position of the objects.

23. The apparatus as in claim 21 further including a sputtering zone positioning means for positioning the sputtering zone so that the objects are above the sputtering zone.

24. The apparatus as in claim 18 wherein the pool of liquid target material is within the chamber.

25. The apparatus as in claim 24 wherein the pool of liquid target material within the chamber is adjacent the outer surface of the cathode assembly.

26. The apparatus as in claim 25 wherein the pool of liquid target material is positioned outside of the chamber, and further includes an isolatable conduit means for forming an isolatable flow path for the liquid target material from the pool to the applying means, the conduit means further penetrates the evacuable chamber and is connected at a first end to the pool and at a second end to the means for applying a layer of the liquid target material.

27. The apparatus as in claim 26 further including a temperature control means for controlling the temperature of the target material.

28. The apparatus as in claim 27 wherein the target material is selected from the group consisting of gallium, cesium, bismuth, rubidium, indium, zinc, and tin.

29. The apparatus as in claim 27 wherein the target material is an alloy selected from the group consisting of tin-lead, tin-bismuth, tin-lead-bismuth, indium-tin, indium-gallium, and gallium-gold.

30. Magnetron cathode sputtering apparatus, comprising:
 (a) an evacuable coating chamber;
 (b) a cathode assembly having an outer surface;
 (c) magnetic means positioned at least partially in a carrier means having an outer surface for providing a defined sputtering zone;
 (d) a pool within the chamber for liquid target material to be sputtered, the pool extending parallel to and adjacent the outer surface of the carrier means;
 (e) means for applying a layer of liquid target material from the pool of liquid target material onto the outer surface of the cathode assembly; and
 (f) means for supporting and positioning substrates to be coated in the chamber and in proximity to the sputtering zone.

31. The apparatus as in claim 30 wherein the cathode assembly has a surface generally exposed in a direction other than vertically upwards.

32. The apparatus as in claim 30 wherein the surface generally exposed in a direction other than vertically upwards faces sideways.

33. The apparatus as in claim 30 further including a temperature control means for controlling the temperature of the liquid target material.

34. The apparatus as in claim 33 wherein the sputtering zone is below the position of the substrates.

35. The apparatus as in claim 33 further including a sputtering zone positioning means for positioning the sputtering zone so that the substrates face the sputtering zone.

36. The apparatus as in claim 30 wherein the pool of liquid target material is within the chamber.

37. The apparatus as in claim 36 wherein the pool of liquid target material within the chamber is adjacent the outer surface of the cathode assembly.

38. The apparatus as in claim 30 wherein a second pool of liquid target material is positioned outside of the chamber, and further includes an isolatable conduit means for forming an isolatable flow path for the liquid target material from the pool to the applying means, the conduit means further penetrates the evacuable chamber and is connected at a first end to the pool and at a second end to the means for applying a layer of the liquid target material.

39. The apparatus as in claim 38 further including a temperature control means for controlling the temperature of the target material.

40. The apparatus as in claim 39 wherein the target material is selected from the group consisting of gallium, cesium, bismuth, rubidium, indium, zinc, and tin.

41. The apparatus as in claim 39 wherein the target material is an alloy selected from the group consisting of tin-lead, tin-bismuth, tin-lead-bismuth, indium-tin, indium-gallium, and gallium-gold.

42. A method of sputtering target material onto a substrate by utilizing a cathode member of a sputtering apparatus, the cathode member having an exterior surface whereof at least a portion is downwardly exposed, comprising the steps of:
(a) applying and maintaining a uniform layer of liquid target material to the exterior surface of the cathode member such that at least a portion of said liquid target material exhibits a generally downwardly exposed surface; and
(b) positioning next to the surface of the cathode member the substrate for receiving target material sputtered from said liquid target material exhibiting a generally downwardly exposed surface.

43. The method of claim 42 wherein step (a) is performed by applying the liquid target material by intermediate transfer means to the exterior surface of the cathode member.

44. The method of claim 42 wherein step (a) is performed by applying the liquid target material by transfer roller means to the exterior surface of the cathode member.

45. The method of claim 42 wherein step (a) is performed by applying the liquid target material by wiper application means to the exterior surface of the cathode member.

46. The method of claim 42 wherein step (a) is performed by applying the liquid target material by spray application means to the exterior surface of the cathode member.

47. The method of claim 42 wherein step (a) is performed by applying the liquid target material to the exterior surface of the cathode member by at least one of the processes selected from the group consisting of brushing, dripping, flowing, smearing, centrifuging and immersing.

48. The method of claim 42 wherein step (a) is performed by applying the liquid target material to the exterior surface of the cathode member by a combination of any ones of the processes selected from the group consisting of roller transfer, wiping, spraying, brushing, dripping, flowing, smearing, centrifuging, and immersing.

49. The method of claim 42 wherein the substrate in step (b) is positioned above the surface of the cathode member for receiving the target material sputtered from the liquid target material.

50. The method of claim 42 wherein the substrate in step (b) is positioned over the surface of the cathode member for receiving the target material sputtered from the liquid target material.

51. The method of claim 42 wherein the substrate in step (b) is positioned under the surface of the cathode member for receiving the target material sputtered from the liquid target material.

52. The method of claim 42 wherein the substrate in step (b) is positioned relative to the surface of the cathode member for receiving at a predetermined angle the target material sputtered from the liquid target material.

53. The method of claim 42 wherein the cathode member is tubular.

54. The method of claim 53 wherein the cathode member rotates to form a rotating cathode member having a rotating exterior circular surface.

55. The method of claim 54 wherein the step of positioning further includes passing the substrates beneath the rotating exterior circular surface of the rotating cathode member to receive the target material sputtered from said liquid target material.

56. The method of claim 42 wherein the exterior surface has a cross-sectional shape which is circular.

57. The method of claim 42 wherein the target material is selected from the group consisting of gallium, cesium, bismuth, rubidium, indium, zinc and tin.

58. The method of claim 42 wherein the target material is an a selected from the group consisting of tin-lead, tin-bismuth, tin-lead-bismuth, indium-tin, indium-gallium, and gallium-gold.

59. The method of claim 42 further including the step of controlling the temperature of the liquid target material.

60. A method of sputtering target material onto substrates by utilizing a rotating cathode member of a magnetron sputtering apparatus, the cathode member having a rotating exterior surface, comprising the steps of:
(a) applying a liquid target material to the rotating exterior surface of the rotating cathode member by intermediate transfer means; and
(b) positioning next to the rotating exterior surface of the rotating cathode member the substrates to receive the target material sputtered from said liquid target material.

61. The method of claim 60 wherein the rotating cathode member is tubular.

62. The method of claim 61 wherein the exterior surface has a cross-sectional shape which is circular.

63. The method of claim 62 wherein the step of positioning further includes passing the substrates beneath the rotating exterior circular surface of the rotating cathode member to receive the target material sputtered from said liquid target material.

64. The method of claim 60 wherein the target material is selected from the group consisting of gallium, cesium, bismuth, rubidium, indium, zinc and tin.

65. The method of claim 60 wherein the target material is an alloy selected from the group consisting of tin-lead, tin-bismuth, tin-lead-bismuth, indium-tin, indium-gallium, and gallium-gold.

66. The method of claim 61 further including the step of controlling the temperature of the liquid target material.

67. Sputtering apparatus for sputtering a target material upon a substrate, comprising:
 (a) an evacuable coating chamber having a sputtering zone;
 (b) a cathode assembly having an outer surface;
 (c) a pool within the chamber for liquid target material to be sputtered;
 (d) means for applying and maintaining a uniform layer of the liquid target material from the pool of liquid target material on the outer surface of the cathode assembly such that at least a portion of the layer exhibits a generally downwardly exposed surface; and
 (e) means for transporting substrates into the vicinity of the cathode assembly for receiving target material sputtered from the layer of the liquid target material exhibiting the generally downwardly exposed surface.

68. The apparatus as in claim 67 wherein the cathode assembly has a generally downwardly exposed surface portion.

69. The apparatus as in claim 67 wherein the generally downwardly exposed surface portion faces directly downwards.

70. The apparatus as in claim 67 further including a temperature control means for controlling the temperature of the target material.

71. The apparatus as in claim 70 wherein the sputtering zone is above the position of the substrates.

72. The apparatus as in claim 70 further including a sputtering zone positioning means for positioning the sputtering zone so that the substrates are beneath the sputtering zone.

73. The apparatus as in claim 67 wherein the pool of liquid target material is within the chamber.

74. The apparatus as in claim 73 wherein the pool of liquid target material within the chamber is adjacent the outer surface of the cathode assembly.

75. The apparatus as in claim 67 wherein a second pool of liquid target material is positioned outside of the chamber, and further includes an isolatable conduit means for forming an isolatable flow path for the liquid target material from the pool to the applying means, the conduit means further penetrates the evacuable chamber and is connected at a first end to the pool and at a second end to the means for applying a layer of the liquid target material.

76. The apparatus as in claim 75 further including a temperature control means for controlling the temperature of the target material.

77. The apparatus as in claim 76 wherein the target material is selected from the group consisting of gallium, cesium, bismuth, rubidium, indium, zinc, and tin.

78. The apparatus as in claim 76 wherein the target material is an alloy selected from the group consisting of tin-lead, tin-bismuth, tin-lead-bismuth, indium-tin, indium-gallium, and gallium-gold.

79. Magnetron cathode sputtering apparatus, comprising:
 (a) an evacuable coating chamber;
 (b) a cathode assembly having an outer surface;
 (c) magnetic means positioned at least partially in a carrier means for providing a defined sputtering zone;
 (d) a pool within the chamber for liquid target material to be sputtered, the pool extending parallel to and adjacent the outer surface of the carrier means;
 (e) means for applying and maintaining a uniform layer of liquid target material from the pool of liquid target material on the outer surface of the cathode assembly; and
 (f) means for supporting and positioning substrates to be coated in the chamber and in proximity to the sputtering zone.

80. The apparatus as in claim 79 wherein the cathode assembly has a generally downwardly exposed surface.

81. The apparatus as in claim 80 wherein the generally downwardly exposed surface portion faces directly downwards.

82. The apparatus as in claim 79 further including a temperature control means for controlling the temperature of the target material.

83. The apparatus as in claim 82 wherein the sputtering zone is above the position of the substrates.

84. The apparatus as in claim 82 further including a sputtering zone positioning means for positioning the sputtering zone so that the substrates are beneath the sputtering zone.

85. The apparatus as in claim 79 wherein the pool of liquid target material is within the chamber.

86. The apparatus as in claim 85 wherein the pool of liquid target material within the chamber is adjacent the outer surface of the cathode assembly.

87. The apparatus as in claim 79 wherein the pool of liquid target material is positioned outside of the chamber, and further includes an isolatable conduit means for forming an isolatable flow path for the liquid target material from the pool to the applying means, the conduit means further penetrates the evacuable chamber and is connected at a first end to the pool and at a second end to the means for applying a layer of the liquid target material.

88. The apparatus as in claim 87 further including a temperature control means for controlling the temperature of the target material.

89. The apparatus as in claim 88 wherein the target material is selected from the group consisting of gallium, cesium, bismuth, rubidium, indium, zinc, and tin.

90. The apparatus as in claim 88 wherein the target material is an alloy selected from the group consisting of tin-lead, tin-bismuth, tin-lead-bismuth, indium-tin, indium-gallium, and gallium-gold.

91. Rotatable magnetron sputtering apparatus for sputtering a target material upon substrates, which comprises:
 (a) an evacuable coating chamber;
 (b) a cathode assembly having an elongated rotatable cylindrical tube mounted in the chamber, the tube having an outer surface;
 (c) magnetic means positioned at least partially in the cylindrical tube for providing a sputter zone of defined width extending lengthwise of the cylindrical tube;
 (d) means for rotating the elongated rotatable cylindrical tube;

(e) a pool for liquid target material to be sputtered;

(f) means for applying a substantially uniform thickness of the liquid target material from the pool of liquid target material on and extending lengthwise of the outer surface of the elongated rotatable cylindrical tube for sputtering as the tube is rotated in the sputtering zone; and (g) means for transporting substrates into the vicinity of the sputtering zone of the elongated rotatable cylindrical tube to receive the target material sputtered from the outer surface of the cylindrical tube.

92. The apparatus as in claim 91 further including a temperature control means for controlling the temperature of the target material.

93. The apparatus as in claim 92 the outer surface of the elongated rotatable cylindrical tube is circular.

94. The apparatus as in claim 93 wherein the sputtering zone is above the position of the substrates.

95. The apparatus as in claim 93 further including a sputtering zone positioning means for positioning the sputtering zone so that the substrates are beneath the sputtering zone.

96. The apparatus as in claim 91 wherein the pool of liquid target material is within the chamber.

97. The apparatus as in claim 96 wherein the pool of liquid target material within the chamber extends parallel to and adjacent the outer surface of the cylindrical tube.

98. The apparatus as in claim 91 wherein the pool of liquid target material is positioned outside of the chamber, and further includes an isolatable conduit means for forming an isolatable flow path for the liquid target material from the pool to the applying means, the conduit means further penetrates the evacuable chamber and is connected at a first end to the pool and at a second end to the applying means.

99. The apparatus as in claim 98 further including a temperature control means for controlling the temperature of the target material.

100. The apparatus as in claim 99 wherein the rotating means is positioned outside of the chamber.

101. The apparatus as in claim 99 wherein the target material is selected from the group consisting of gallium, cesium, bismuth, rubidium, indium, zinc, and tin.

102. The apparatus as in claim 99 wherein the target material is an alloy selected from the group consisting of tin-lead, tin-bismuth, tin-lead-bismuth, indium-tin, indium-gallium, and gallium-gold.

103. Magnetron cathode sputtering apparatus, comprising:

(a) an evacuable coating chamber;

(b) a cathode assembly having an elongated rotatable carrier means mounted in the chamber, the carrier means having an outer surface;

(c) magnetic means positioned at least partially in the carrier means for providing a sputter zone of defined width extending lengthwise of the carrier means;

(d) a pool within the chamber for liquid target material to be sputtered, the pool extending parallel to and adjacent the outer surface of the carrier means;

(e) means for applying and maintaining a uniform layer of liquid target material from the pool of liquid target material on the outer surface of the carrier means for sputtering;

(f) means for rotating the carrier means about its longitudinal axis; and (g) means for supporting and positioning substrates to be coated in the chamber and in proximity to the sputtering zone.

104. The apparatus as in claim 103 further including a temperature control means for controlling the temperature of the target material.

105. The apparatus as in claim 104 wherein the rotatable carrier means is a cylindrical tube having an outer surface.

106. The apparatus as in claim 105 wherein the outer surface of the rotatable carrier means is substantially circular.

107. The apparatus as in claim 106 wherein the layer of liquid target material is of substantially uniform thickness.

108. The apparatus as in claim 107 wherein the sputtering zone is above the position of the substrates.

109. The apparatus as in claim 107 further including a sputtering zone positioning means for positioning the sputtering zone so that the substrates are beneath the sputtering zone.

110. The apparatus as in claim 106 wherein the applying means comprises a wiper extending lengthwise and parallel to the outer surface of the tube.

111. The apparatus as in claim 110 wherein the applying means comprises a transfer drum positioned parallel to and in lengthwise contact with the outer surface the tube, the transfer drum further positioned to contact the liquid target material in the pool of liquid target material to be sputtered.

112. The apparatus as in claim 111 wherein the target material is selected from the group consisting of gallium, cesium, bismuth, rubidium, indium, zinc, and tin.

113. The apparatus as in claim 111 wherein the target material is an alloy selected from the group consisting of tin-lead, tin-bismuth, tin-lead-bismuth, indium-tin, indium-gallium, and gallium-gold.

* * * * *